US012813221B2

(12) United States Patent
Cong et al.

(10) Patent No.: US 12,813,221 B2
(45) Date of Patent: Nov. 24, 2026

(54) TRANSFER APPARATUS, AND RELATED COMPONENTS AND METHODS, FOR TRANSFERRING SUBSTRATES

(71) Applicant: Applied Materials, Inc., Santa Clara, CA (US)

(72) Inventors: Zhepeng Cong, San Jose, CA (US); Ashur J. Atanos, San Jose, CA (US); Masato Ishii, Sunnyvale, CA (US); Andrew Kretzschmar, Wimberley, TX (US)

(73) Assignee: Applied Materials, Inc., Santa Clara, CA (US)

( * ) Notice: Subject to any disclaimer, the term of this patent is extended or adjusted under 35 U.S.C. 154(b) by 976 days.

(21) Appl. No.: 17/991,540

(22) Filed: Nov. 21, 2022

(65) Prior Publication Data

US 2024/0170321 A1 May 23, 2024

(51) Int. Cl.
*H10P 72/76* (2026.01)
*H01L 21/677* (2006.01)
*H01L 21/687* (2006.01)

(52) U.S. Cl.
CPC ...... *H10P 72/7602* (2026.01); *H10P 72/7614* (2026.01); *H10P 72/7616* (2026.01)

(58) Field of Classification Search
CPC ............. H10P 72/7602; H10P 72/7614; H10P 72/7616; B25J 9/042; B25J 9/043
See application file for complete search history.

(56) References Cited

U.S. PATENT DOCUMENTS 6,053,982 A * 4/2000 Halpin .............. C23C 16/45521 118/500
8,382,180 B2 2/2013 Kanawade et al.
(Continued)

FOREIGN PATENT DOCUMENTS

CN 113990780 A 1/2022
CN 111893567 B 2/2022
(Continued)

OTHER PUBLICATIONS

"Thermal properties, SiC—Silicon Carbide", https://www.ioffe.ru/SVA/NSM/Semicond/SiC/thermal.html, Accessed Mar. 3, 2026 (Year: 2001).*
(Continued)

*Primary Examiner* — Gerald McClain
(74) *Attorney, Agent, or Firm* — Patterson + Sheridan, LLP

(57) ABSTRACT

Implementations include flow guides, process kits, and related methods for processing chambers to facilitate deposition process adjustability. In one implementation, a process kit for disposition in a processing chamber applicable for use in semiconductor manufacturing includes a plate having a first face and a second face opposing the first face. The process kit includes a liner. The liner includes an annular section, and one or more ledges extending inwardly relative to the annular section. The one or more ledges are configured to support one or more outer regions of the second face of the plate. The liner includes one or more inlet openings extending to an inner surface of the annular section on a first side of the liner, and one or more outlet openings extending to the inner surface of the annular section on a second side of the liner.

20 Claims, 9 Drawing Sheets

(56) References Cited

U.S. PATENT DOCUMENTS

| | | | | |
|---|---|---|---|---|
| 8,852,348 | B2 * | 10/2014 | Parkhe | C23C 16/463 118/724 |
| 9,202,738 | B2 * | 12/2015 | Greenberg | H10P 72/78 |
| 9,991,152 | B2 * | 6/2018 | Ingram-Goble | H10P 72/78 |
| 10,431,489 | B2 | 10/2019 | Agarwal et al. | |
| 11,075,105 | B2 | 7/2021 | Sarode Vishwanath et al. | |
| 11,315,823 | B2 * | 4/2022 | Yoshida | H10P 72/78 |
| 11,935,779 | B2 * | 3/2024 | Lee | H10P 72/0458 |
| 2004/0046096 | A1 * | 3/2004 | Chen | H10P 72/7614 248/346.01 |
| 2008/0105201 | A1 * | 5/2008 | Ronan | H10P 72/7614 118/500 |
| 2009/0250955 | A1 | 10/2009 | Aoki | |
| 2015/0217456 | A1 * | 8/2015 | Tsuji | B25J 15/0014 156/273.1 |
| 2018/0315626 | A1 | 11/2018 | Franklin | |
| 2021/0193461 | A1 | 6/2021 | Citla et al. | |
| 2022/0121196 | A1 | 4/2022 | Omori | |
| 2022/0162751 | A1 | 5/2022 | Haanstra et al. | |
| 2022/0170156 | A1 | 6/2022 | Jdira et al. | |
| 2022/0181193 | A1 | 6/2022 | Gao et al. | |
| 2022/0189804 | A1 | 6/2022 | Luan et al. | |
| 2022/0199444 | A1 | 6/2022 | Oosterlaken et al. | |
| 2022/0254668 | A1 | 8/2022 | Oosterlaken et al. | |
| 2022/0268520 | A1 | 8/2022 | Oosterlaken et al. | |
| 2022/0298643 | A1 | 9/2022 | Kajbafvala et al. | |
| 2022/0298672 | A1 | 9/2022 | M'Saad et al. | |
| 2022/0301829 | A1 | 9/2022 | Yoshikawa | |
| 2022/0301905 | A1 | 9/2022 | Ye et al. | |
| 2022/0301906 | A1 | 9/2022 | Naik et al. | |
| 2022/0336248 | A1 * | 10/2022 | Srivastava | H10P 72/3302 |
| 2022/0352006 | A1 | 11/2022 | Huang et al. | |
| 2022/0359246 | A1 | 11/2022 | Umeoka | |
| 2024/0274448 | A1 * | 8/2024 | Cong | H10P 72/0464 |

FOREIGN PATENT DOCUMENTS

| | | | | |
|---|---|---|---|---|
| CN | 114000192 | A | 2/2022 | |
| CN | 111254487 | B | 3/2022 | |
| CN | 114138030 | A | 3/2022 | |
| CN | 114158145 | A | 3/2022 | |
| CN | 114351249 | A | 4/2022 | |
| CN | 111235551 | B | 5/2022 | |
| CN | 114481311 | A | 5/2022 | |
| CN | 114540947 | A | 5/2022 | |
| CN | 114540948 | A | 5/2022 | |
| CN | 114551331 | A | 5/2022 | |
| CN | 114613703 | A | 6/2022 | |
| CN | 114743924 | A | 7/2022 | |
| CN | 114823428 | A | 7/2022 | |
| CN | 114855272 | A | 8/2022 | |
| CN | 114883221 | A | 8/2022 | |
| CN | 114914181 | A | 8/2022 | |
| CN | 114927450 | A | 8/2022 | |
| CN | 115020281 | A | 9/2022 | |
| CN | 115101432 | A | 9/2022 | |
| CN | 115101443 | A | 9/2022 | |
| CN | 115101470 | A | 9/2022 | |
| CN | 115233303 | A | 10/2022 | |
| CN | 115235257 | A | 10/2022 | |
| CN | 115274510 | A | 11/2022 | |
| CN | 115312432 | A | 11/2022 | |
| CN | 115404543 | A | 11/2022 | |
| EP | 1063683 | A2 * | 12/2000 | H10P 72/7602 |
| JP | H6-224281 | A | 8/1994 | |
| JP | 200153135 | A | 2/2001 | |
| JP | 201067871 | A | 3/2010 | |
| JP | 2022522420 | A | 4/2022 | |
| KR | 20010019206 | A | 3/2001 | |

OTHER PUBLICATIONS

"Silicon-based ultra-broadband mid-IR and LWIR near-perfect metamaterial absorber", Optical and Quantum Electronics, https://link.springer.com/article/10.1007/s11082-024-06996-2, accessed Mar. 3, 2026 (Year: 2024).*

Korean Office Action dated Dec. 15, 2025 for Application No. 10-2025-7020308.

International Search Report and Written Opinion dated Nov. 2, 2023 for Application No. PCT/US2023/027836.

Office Action from Japanese Patent Application No. 2025-528436, dated Jul. 14, 2026.

* cited by examiner

TRANSFER APPARATUS, AND RELATED COMPONENTS AND METHODS, FOR TRANSFERRING SUBSTRATES

BACKGROUND

Field

The present disclosure relates to transfer apparatus, and related components and methods, for transferring substrates in relation to substrate processing operations for semiconductor manufacturing.

Description of the Related Art

Semiconductor substrates are processed for a wide variety of applications, including the fabrication of integrated devices and microdevices. Temperature differences between substrates and transfer components can hinder operations. As an example, temperature differences can cause lower heating powers and/or lower processing temperatures, which can cause longer processing times and lower throughput. As another example, temperature differences can cause thermal shock (which can bow substrates), which hinders device performance and lowers throughput. As another example, temperature differences can affect deposition uniformity on substrates, which hinders device performance and lowers throughput.

Such issues can be exacerbated by relatively complex deposition operations (such as high-temperature deposition operations).

Therefore, a need exists for improved transfer apparatus, and related components and methods, that facilitate reduced thermal shock and increased throughput.

SUMMARY

The present disclosure relates to transfer apparatus, and related components and methods, for transferring substrates in relation to substrate processing operations for semiconductor manufacturing.

In one implementation, a transfer apparatus for moving a substrate in relation to semiconductor manufacturing includes a body, and a plurality of substrate supports inserted at least partially into the body. Each of the plurality of substrate supports includes an inner segment, and one or more fins extending outwardly relative to the inner segment. Each of the inner segment and the one or more fins includes silicon carbide (SiC).

In one implementation, a transfer apparatus for moving a substrate in relation to semiconductor manufacturing includes a body. The body includes a wrist, and a plurality of arms defining a support face. The plurality of arms each have an arm thickness, and the plurality of arms are each formed of an arm material. The transfer apparatus includes a plurality of substrate supports inserted at least partially into the support face of the body. Each of the plurality of substrate supports is formed of a support material that is different than the arm material. Each of the plurality of substrate supports includes an inner segment, and one or more fins extending outwardly relative to the inner segment. Each of the one or more fins has a fin thickness that is a thickness ratio of the arm thickness, and the thickness ratio is 0.7 or less.

In one implementation, a method of processing a substrate for semiconductor manufacturing includes heating a substrate positioned in a processing volume of a processing chamber. The method includes flowing one or more process gases over the substrate to form one or more layers on the substrate, and moving a transfer apparatus into the processing volume. The transfer apparatus includes a body, and a plurality of substrate supports inserted at least partially into the body. Each of the plurality of substrate supports includes silicon carbide (SiC). The method includes engaging the substrate with the plurality of substrate supports, and moving the substrate out of the processing volume while the substrate is supported on the plurality of substrate supports.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to transfer apparatus, and related components and methods, for transferring substrates in relation to substrate processing operations for semiconductor manufacturing.

Figure 1:
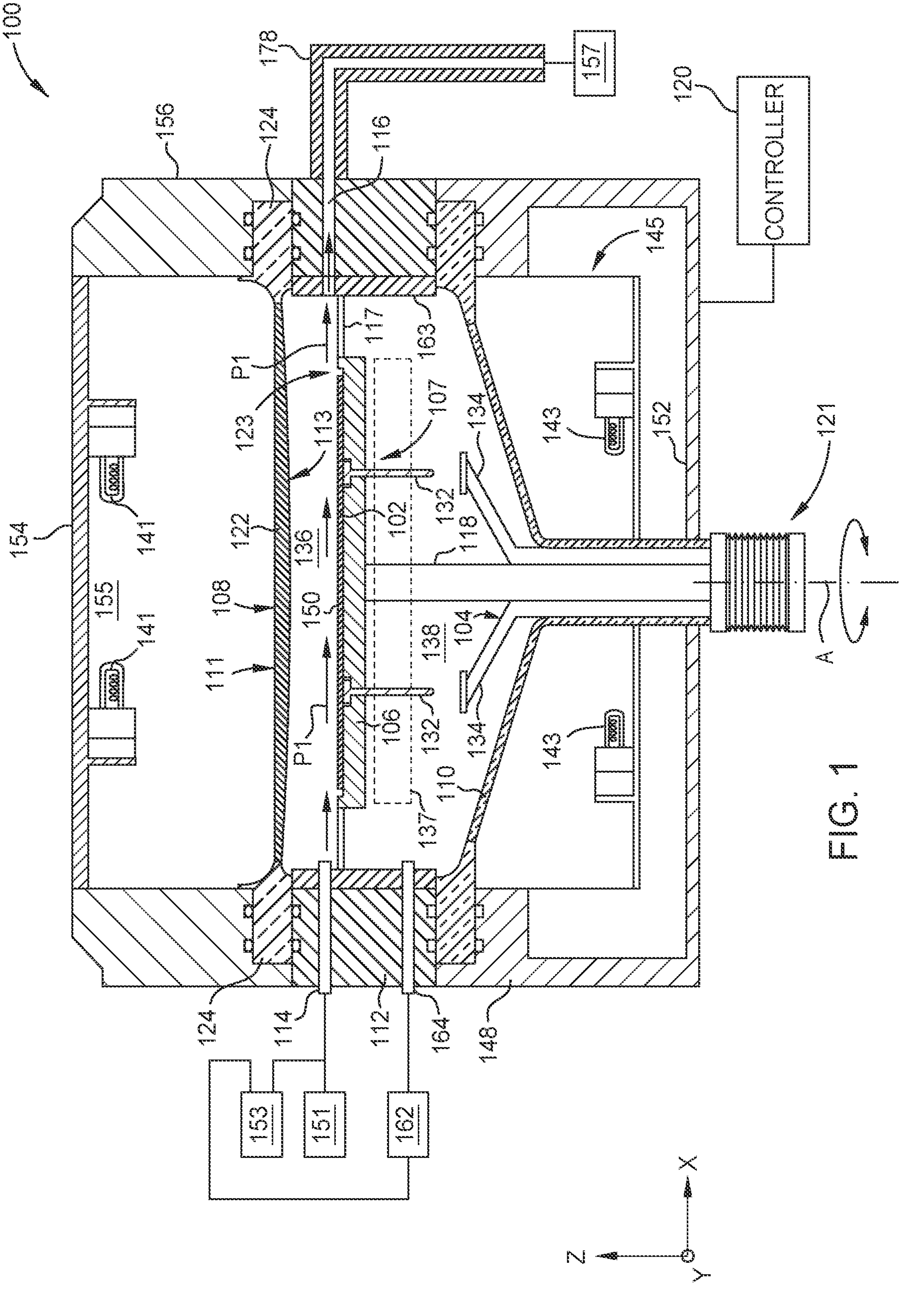
FIG. 1 is a schematic side cross-sectional view of a processing chamber, according to one implementation

FIG. 1 is a schematic side cross-sectional view of a processing chamber 100, according to one implementation. The processing chamber 100 is a deposition chamber. In one embodiment, which can be combined with other embodiments, the processing chamber 100 is an epitaxial deposition chamber. The processing chamber 100 is utilized to grow an epitaxial film on a substrate 102. The processing chamber 100 creates a cross-flow of precursors across a top surface 150 of the substrate 102.

The processing chamber 100 includes an upper body 156, a lower body 148 disposed below the upper body 156, and a flow module 112 disposed between the upper body 156 and the lower body 148. The upper body 156, the flow module 112, and the lower body 148 form a chamber body. Disposed within the chamber body is a substrate support 106, an upper window 108 (such as an upper dome), a lower window 110 (such as a lower dome), a plurality of upper heat sources 141, and a plurality of lower heat sources 143. As shown, a controller 120 is in communication with the processing chamber 100 and is used to control processes and methods, such as the operations of the methods described herein. The controller 120 and the processing chamber 100 can be part of a substrate processing system.

In the implementation shown in FIG. 1, the heat sources 141, 143 are lamps. Other heat sources are contemplated, such as resistive heaters, light emitting diodes (LEDs), and/or lasers.

The substrate support 106 is disposed between the upper window 108 and the lower window 110. The substrate support 106 includes a support face 123 that supports the substrate 102. The plurality of upper heat sources 141 are disposed between the upper window 108 and a lid 154. The plurality of upper heat sources 141 form a portion of the upper heating module 155. The lid 154 may include a plurality of sensors (such as pyrometers) disposed therein or thereon for measuring the temperature within the processing chamber 100. The plurality of lower heat sources 143 are disposed between the lower window 110 and a chamber floor 152. The plurality of lower heat sources 143 form a portion of a lower heating module 145. The upper window 108 is an upper dome and is formed at least partially of an energy transmissive material, such as quartz. The lower window 110 is a lower dome and is formed at least partially of an energy transmissive material, such as quartz.

A process volume 136 and a purge volume 138 are positioned between the upper window 108 and the lower window 110. The process volume 136 and the purge volume 138 are part of an internal volume defined at least partially by the upper window 108, the lower window 110, and the one or more liners 163. The upper window 108 at least partially defines the process volume 136.

The window 108 includes a first face 111 that is concave or flat (in the implementation shown in FIG. 1, the first face 111 is flat). The upper window 108 includes a second face 113 that is convex. The second face 113 faces the substrate support 106. The present disclosure contemplates other shapes for the upper window 108. The upper window 108 includes an inner section 122 and an outer section 124. The first face 111 and the second face 113 are at least part of the inner section 122. The inner section 122 is transparent and the outer section 124 is opaque. The outer section 124 is received at least partially in one or more sidewalls (such as in the flow module 112) of the processing chamber 100.

The internal volume has the substrate support 106 disposed therein. The substrate support 106 includes a top surface on which the substrate 102 is disposed. The substrate support 106 is attached to a shaft 118. The shaft 118 is connected to a motion assembly 121. The motion assembly 121 includes one or more actuators and/or adjustment devices that provide movement and/or adjustment for the shaft 118 and/or the substrate support 106 within the processing volume 136.

The substrate support 106 may include lift pin holes 107 disposed therein. The lift pin holes 107 are sized to accommodate a lift pin 132 for lifting of the substrate 102 from the substrate support 106 either before or after a deposition process is performed. The lift pins 132 may rest on lift pin stops 134 when the substrate support 106 is lowered from a process position to a transfer position. The lift pin stops 134 can be coupled to a second shaft 104.

The flow module 112 includes a plurality of gas inlets 114, a plurality of purge gas inlets 164, and one or more gas exhaust outlets 116. The plurality of gas inlets 114 and the plurality of purge gas inlets 164 are disposed on the opposite side of the flow module 112 from the one or more gas exhaust outlets 116. One or more flow guides 117 are disposed below the plurality of gas inlets 114 and the one or more gas exhaust outlets 116. The one or more flow guides can include, for example, one or more pre-heat rings. The one or more flow guides 117 are disposed above the purge gas inlets 164. One or more liners 163 are disposed on an inner surface of the flow module 112 and protects the flow module 112 from reactive gases used during deposition operations and/or cleaning operations. The gas inlet(s) 114 and the purge gas inlet(s) 164 are each positioned to flow a gas parallel to the top surface 150 of a substrate 102 disposed within the process volume 136. The gas inlet(s) 114 are fluidly connected to one or more process gas sources 151 and one or more cleaning gas sources 153. The purge gas inlet(s) 164 are fluidly connected to one or more purge gas sources 162 and/or the one or more cleaning gas sources 153. The one or more gas exhaust outlets 116 are fluidly connected to an exhaust pump 157. One or more process gases supplied using the one or more process gas sources 151 can include one or more reactive gases (such as one or more of silicon (Si), phosphorus (P), and/or germanium (Ge)) and/or one or more carrier gases (such as one or more of nitrogen ($N_2$) and/or hydrogen ($H_2$)). One or more purge gases supplied using the one or more purge gas sources 162 can include one or more inert gases (such as one or more of argon (Ar), helium (He), hydrogen ($H_2$), and/or nitrogen ($N_2$)). One or more cleaning gases supplied using the one or more cleaning gas sources 153 can include one or more of hydrogen (H) and/or chlorine (Cl). In one embodiment, which can be combined with other embodiments, the one or more process gases include silicon phosphide (SiP) and/or phospine ($PH_3$), and the one or more cleaning gases include hydrochloric acid (HCl).

The one or more gas exhaust outlets 116 are further connected to or include an exhaust system 178. The exhaust system 178 fluidly connects the one or more gas exhaust outlets 116 and the exhaust pump 157. The exhaust system 178 can assist in the controlled deposition of a layer on the substrate 102. The exhaust system 178 is disposed on an opposite side of the processing chamber 100 relative to the flow module 112.

The controller 120 includes a central processing unit (CPU), a memory containing instructions, and support circuits for the CPU. The controller 120 controls various items directly, or via other computers and/or controllers. In one or more embodiments, the controller 120 is communicatively coupled to dedicated controllers, and the controller 120 functions as a central controller.

The controller 120 is of any form of a general-purpose computer processor that is used in an industrial setting for controlling various substrate processing chambers and equipment, and sub-processors thereon or therein. The memory, or non-transitory computer readable medium, is one or more of a readily available memory such as random access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)), read only memory (ROM), floppy disk, hard disk, flash drive, or any other form of digital storage, local or remote. The support circuits of the controller 120 are coupled to the CPU for supporting the CPU (a processor). The support circuits include cache, power supplies, clock circuits, input/output circuitry and subsystems, and the like. Operational parameters (a pressure for process gas, a flow rate for process gas, and/or a rotational position of a process kit) and operations are stored in the memory as a software routine that is executed or invoked to turn the controller 120 into a specific purpose controller to control the operations of the various chambers/modules described herein. The controller 120 is configured to conduct any of the operations described herein. The instructions stored on the memory, when executed, cause one or more of operations of method 2000 (described below) to be conducted.

The various operations described herein (such as the operations of the method 2000) can be conducted automatically using the controller 120, or can be conducted automatically or manually with certain operations conducted by a user.

The controller 120 is configured to control the rotational position, the heating, and gas flow through the processing chamber 100 by providing an output to controls for the heat sources 141, 143, the gas flow, and the motion assembly 121. The controls include controls for the upper heat sources 141, the lower heat sources 143, the process gas source 151, the purge gas source 162, the motion assembly 121, and the exhaust pump 157.

The controller 120 is configured to adjust the output to the controls based off of sensor readings, a system model, and stored readings and calculations. The controller 120 includes embedded software and a compensation algorithm(s) to calibrate measurements. The controller 120 can include one or more machine learning algorithms and/or artificial intelligence algorithms that estimate optimized parameters for the deposition operations, the purge operations, and/or the cleaning operations. The one or more machine learning algorithms and/or artificial intelligence algorithms can use, for example, a regression model (such as a linear regression model) or a clustering technique to estimate optimized parameters. The algorithm can be unsupervised or supervised.

Substrates (such as the substrate 102) are transferred into and out of the internal volume of the processing chamber 100 through a transfer door 137 (such as a slit valve). When the transfer door 137 is open, a transfer apparatus (with a substrate supported thereon) can extend into the internal volume through the transfer door 137 such that the lift pins 132 can lift the substrate from the transfer apparatus and land the substrate on the substrate support 106 for processing. After processing, the lift pins 132 can lift the substrate from the substrate support 106 and land the substrate on a transfer apparatus, and the transfer apparatus can be retracted through the open transfer door 137 to remove the substrate from the processing chamber 100.

Figure 2:
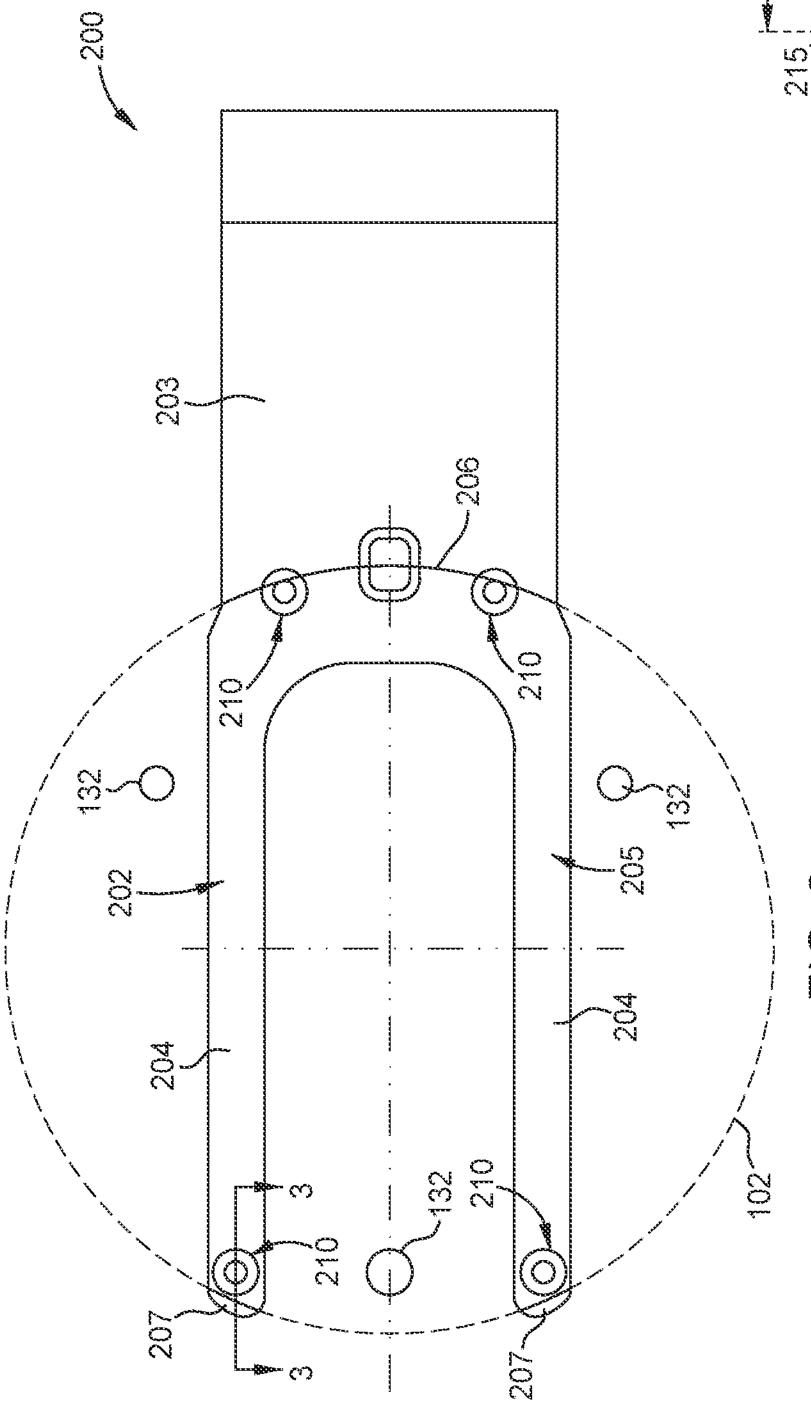
FIG. 2 is a schematic top view of a transfer apparatus for moving a substrate in relation to semiconductor manufacturing, according to one implementation.

FIG. 2 is a schematic top view of a transfer apparatus 200 for moving a substrate 102 in relation to semiconductor manufacturing, according to one implementation.

Figure 3:
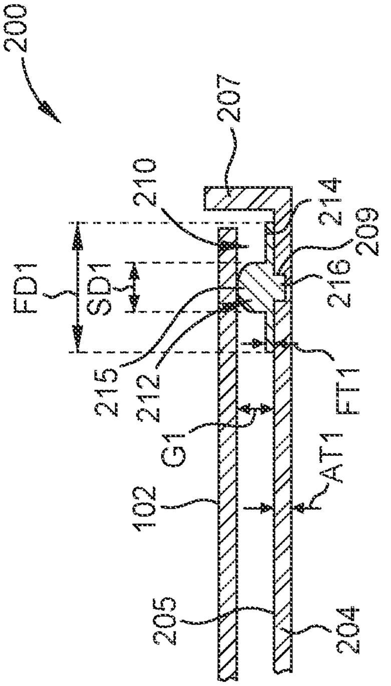
FIG. 3 is a schematic side cross-sectional view of the transfer apparatus, along Section 3-3 shown in FIG. 2, according to one implementation.

FIG. 3 is a schematic side cross-sectional view of the transfer apparatus 200, along Section 3-3 shown in FIG. 2, according to one implementation.

The transfer apparatus 200 includes a body 202, and a plurality of substrate supports 210 inserted at least partially into the body 202. In one or more embodiments, the body 202 is a blade, for example a robot blade that attaches to a transfer robot in a transfer chamber. Each of the plurality of substrate supports 210 includes an inner segment 212 and one or more fins 214 extending outwardly relative to the inner segment 212. In the implementation shown in FIG. 2, the transfer apparatus 200 includes four substrate supports 210. Other numbers of substrate supports 210 are contemplated.

The body 202 includes a wrist 203, and a plurality of arms 204 defining a support face 205. The plurality of arms 204 are each formed of an arm material. The substrate supports 210 are inserted at least into the support face 205 of the body 202. The wrist 203 includes a wrist ledge 206, each of the plurality of arms 204 includes an arm ledge 207, and each of the plurality of substrate supports 210 is positioned inwardly of the wrist ledge 206 and each arm ledge 207.

Each of the inner segment 212 and the one or more fins 214 includes silicon carbide (SiC). In one or more embodiments, each of the inner segment 212 and the one or more fins 214 is formed of the SiC. In one or more examples, each of the inner segment 212 and the one or more fins 214 has a composition that is at least 95% silicon and carbon by atomic percentage. In one or more embodiments, each of the inner segment 212 and the one or more fins 214 is formed of graphite coated with the SiC. In one or more embodiments, each of the plurality of substrate supports 210 is formed of a support material that is different than the arm material. In one or more embodiments, the arm material includes quartz ($SiO_2$). In one or more embodiments, the arm material is transmissive for at least 95% of light having a wavelength in the infrared (IR) range. In one or more embodiments, the support material has an absorptivity that absorbs at least 95% of light having a wavelength in the infrared (IR) range. In one or more embodiments, the support material has a thermal conductivity that is at least 100 W/m*° K. In one or more embodiments, the support material has an electrical resistivity that is 1.0 Mega-Ohm or higher, such as 2.0 Mega-Ohms or higher.

The substrate supports 210 can be formed by machining a solid block of SiC. The substrate supports 210 can be formed by injection molding graphite, and coating the molded graphite with SiC. Other methods of forming the substrate supports 210 are contemplated.

In the implementation shown in FIG. 3, the inner segment 212 is semi-ball shaped (such as semi-spherical in shape or semi-ovular in shape) and cylindrical in shape, and each of the one or more fins 214 is cylindrical or rectangular in shape. In the implementation shown in FIG. 2, each of the one or more fins 214 is cylindrical in shape.

Each of the plurality of arms 204 has an arm thickness AT1, and each of the one or more fins 214 has a fin thickness FT1 that is a thickness ratio of the arm thickness. In one or more embodiments, the thickness ratio is 0.7 or less. Each of the inner segments 212 includes a support portion 215 on a first side of the one or more fins 214. The support portion 215 extends past the support face 205 by a gap G1. The gap G1 is a gap ratio of the arm thickness AT1. In one or more embodiments, the gap ratio is 0.3 or higher. The inner segment 212 of each substrate support 210 has a segment major dimension SD1 and each of the one or more fins 214 has a fin major dimension FD1. The fin major dimension FD1 is larger than the segment major dimension SD1. The fin major dimension FD1 is a dimension ratio of the arm thickness AT1. In one or more embodiments, the dimension ratio is 2.0 or higher. In one or more embodiments, the dimension ratio is 4.0 or higher. In one or more embodiments, the arm thickness AT1 is within a range of 2.5 mm to 3.5 mm (such as 3.0 mm), and the fin thickness FT1 is 2.0 mm or less (such as within a range of 1.0 mm to 2.0 mm). Other values are contemplated for the arm thickness AT1 and the fin thickness FT1.

Each of the inner segments 212 includes an insertion portion 216 on a second side of the one or more fins 214. The insertion portion 216 extends into a retention opening 209 formed in one of the plurality of arms 204. In the implementations shown in FIGS. 2 and 3, the insertion portion 216 is cylindrical in shape, and the support portion 215 includes a first section that is cylindrical in shape and a second section (contacting and supporting the substrate 102) that is semi-ball shaped (such as semi-spherical in shape or semi-ovular in shape). In the implementation shown in FIGS. 2 and 3, the one or more fins 214 rest on the support face 205 of the body 202.

Figure 4:
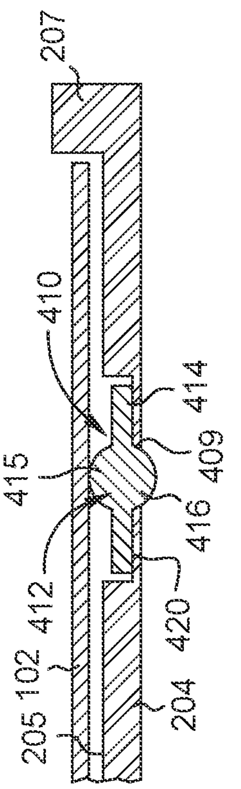
FIG. 4 is a schematic side cross-sectional view of a transfer apparatus, according to one implementation.

FIG. 4 is a schematic side cross-sectional view of a transfer apparatus 400, according to one implementation.

Figure 5:
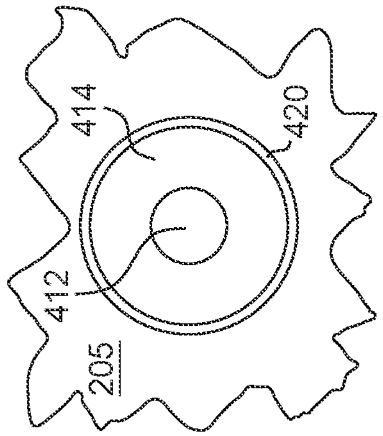
FIG. 5 is a schematic partial top view of the transfer apparatus shown in FIG. 4, according to one implementation.

FIG. 5 is a schematic partial top view of the transfer apparatus 400 shown in FIG. 4, according to one implementation.

Figure 6:
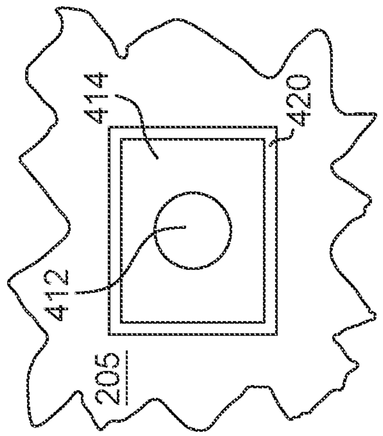
FIG. 6 is a schematic partial top view of the transfer apparatus shown in FIG. 4, according to one implementation.

FIG. 6 is a schematic partial top view of the transfer apparatus 400 shown in FIG. 4, according to one implementation.

The transfer apparatus 400 includes a plurality of substrate supports 410 (one is shown in FIG. 4). Each of the substrate supports 410 can be similar to the substrate supports 210 described above, and can include one or more of the features, aspects, components, operations, and/or properties thereof.

Each substrate support 410 includes an inner segment 412 and one or more fins 414. Each inner segment 412 includes a support portion 415 on a first side of the one or more fins 414. Each inner segment 412 includes an insertion portion 416 on a second side of the one or more fins 414. The insertion portion 416 extends into a retention opening 409 formed in a recessed surface 420 of one of the plurality of arms 204.

In the implementation shown in FIG. 4, the inner segment 412 is ball shaped (such as spherical in shape or ovular in shape), and each of the one or more fins 414 is cylindrical or rectangular in shape. The support portion 415 is semi-ball shaped (such as semi-spherical in shape or semi-ovular in shape), and the insertion portion 416 is semi-ball shaped (such as semi-spherical in shape or semi-ovular in shape). In the implementation shown in FIG. 4, the one or more fins 414 rest on the recessed surface 420.

In the implementation shown in FIG. 5, each of the one or more fins 414 is cylindrical in shape.

In the implementation shown in FIG. 6, each of the one or more fins 414 is rectangular in shape.

Figure 7:
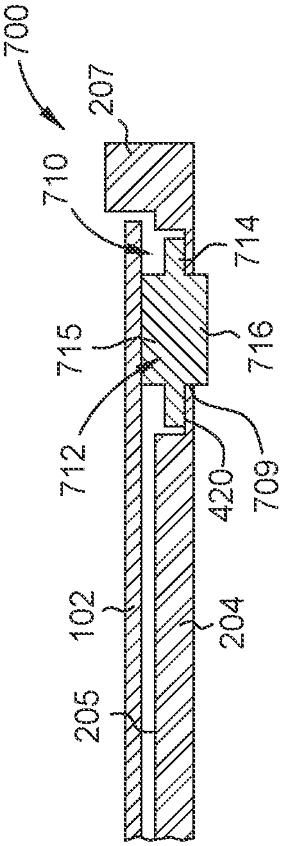
FIG. 7 is a schematic side cross-sectional view of a transfer apparatus, according to one implementation.

FIG. 7 is a schematic side cross-sectional view of a transfer apparatus 700, according to one implementation.

Figure 8:
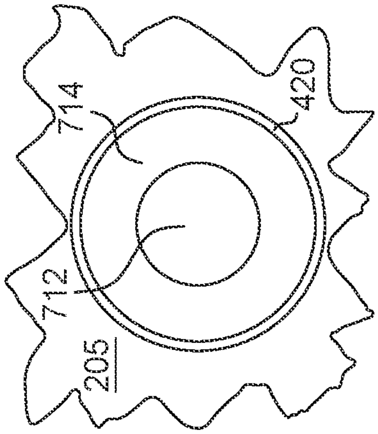
FIG. 8 is a schematic partial top view of the transfer apparatus shown in FIG. 7, according to one implementation.

FIG. 8 is a schematic partial top view of the transfer apparatus 700 shown in FIG. 7, according to one implementation.

Figure 9:
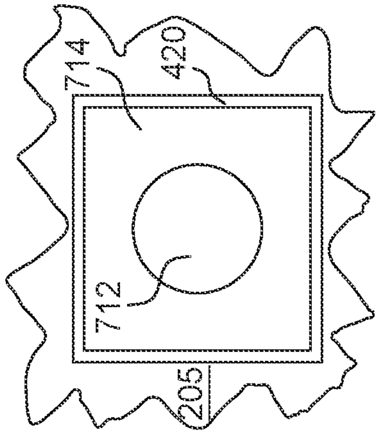
FIG. 9 is a schematic partial top view of the transfer apparatus shown in FIG. 7, according to one implementation.

FIG. 9 is a schematic partial top view of the transfer apparatus 700 shown in FIG. 7, according to one implementation.

Figure 10:
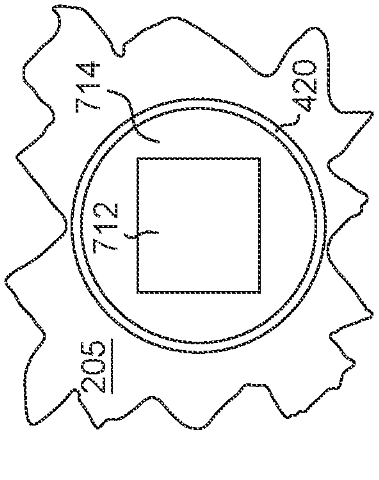
FIG. 10 is a schematic partial top view of the transfer apparatus shown in FIG. 7, according to one implementation.

FIG. 10 is a schematic partial top view of the transfer apparatus 700 shown in FIG. 7, according to one implementation.

Figure 11:
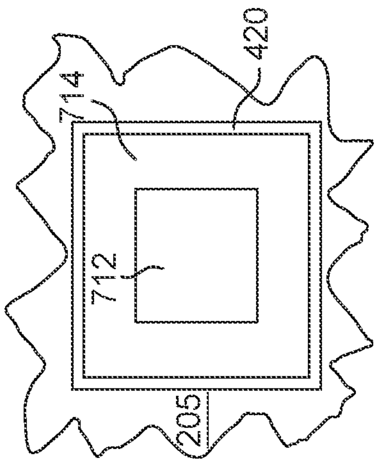
FIG. 11 is a schematic partial top view of the transfer apparatus shown in FIG. 7, according to one implementation.

FIG. 11 is a schematic partial top view of the transfer apparatus 700 shown in FIG. 7, according to one implementation.

The transfer apparatus 700 includes a plurality of substrate supports 710 (one is shown in FIG. 7). Each of the substrate supports 710 can be similar to the substrate supports 210 described above, and can include one or more of the features, aspects, components, operations, and/or properties thereof.

Each substrate support 710 includes an inner segment 712 and one or more fins 714. Each inner segment 712 includes a support portion 715 on a first side of the one or more fins 714. Each inner segment 712 includes an insertion portion 716 on a second side of the one or more fins 714. The insertion portion 716 extends into a retention opening 709 formed in the recessed surface 420 of one of the plurality of arms 204.

In the implementation shown in FIG. 7, the inner segment 712 is rectangular or cylindrical in shape, and each of the one or more fins 714 is cylindrical or rectangular in shape. The support portion 715 is cylindrical or rectangular in shape, and the insertion portion 716 is cylindrical or rectangular in shape.

In the implementation shown in FIG. 8, the inner segment 712 is cylindrical in shape, and each of the one or more fins 714 is cylindrical in shape.

In the implementation shown in FIG. 9, the inner segment 712 is cylindrical in shape, and each of the one or more fins 714 is rectangular in shape. As an example, each of the one or more fins 714 can be a rectangular block, such as a cube.

In the implementation shown in FIG. 10, the inner segment 712 is rectangular in shape, and each of the one or more fins 714 is cylindrical in shape.

In the implementation shown in FIG. 11, the inner segment 712 is rectangular in shape, and each of the one or more fins 714 is rectangular in shape.

Figure 12:
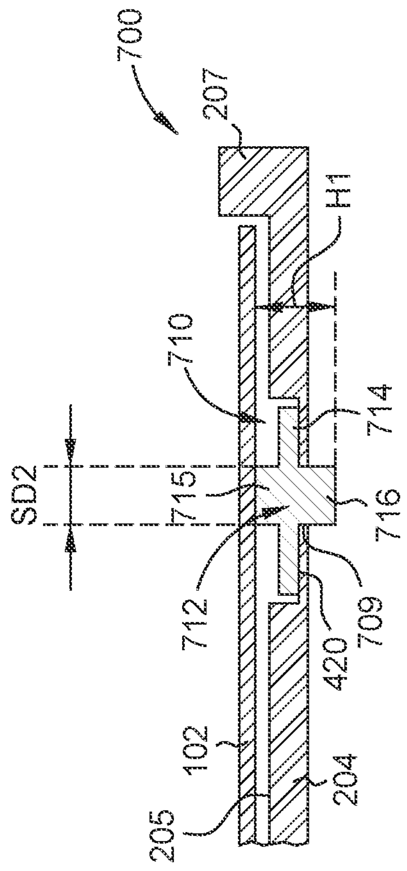
FIG. 12 is a schematic side cross-sectional view of the transfer apparatus shown in FIGS. 7-11, according to one implementation.

FIG. 12 is a schematic side cross-sectional view of the transfer apparatus 700 shown in FIGS. 7-11, according to one implementation. In the implementation shown in FIG. 12, the inner segment 712 has a segment major dimension SD2 that is smaller than a height H1 of the inner segment 712. In the implementation shown in FIG. 7, the segment major dimension SD2 is larger than the height H1. In one or more embodiments, each major dimension SD1, SD2, FD1 is a diameter or a width.

Figure 13:
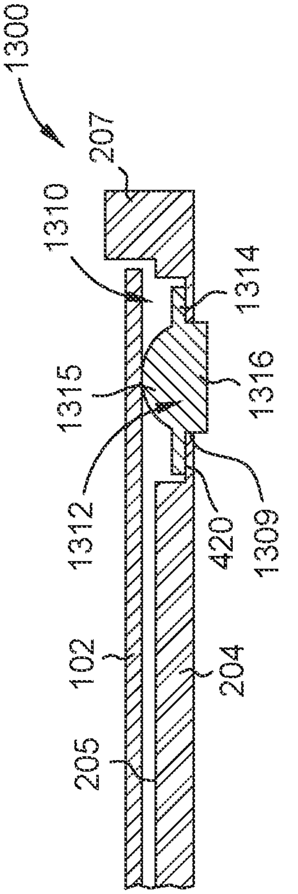
FIG. 13 is a schematic side cross-sectional view of a transfer apparatus, according to one implementation.

FIG. 13 is a schematic side cross-sectional view of a transfer apparatus 1300, according to one implementation.

Figure 14:
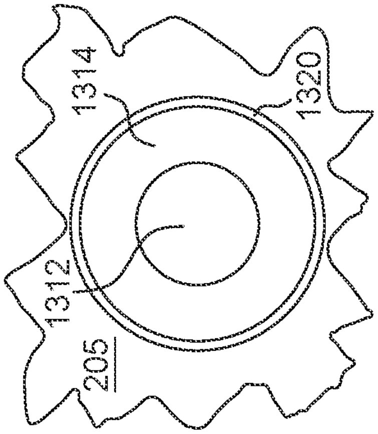
FIG. 14 is a schematic partial top view of the transfer apparatus shown in FIG. 13, according to one implementation.

FIG. 14 is a schematic partial top view of the transfer apparatus 1300 shown in FIG. 13, according to one implementation.

Figure 15:
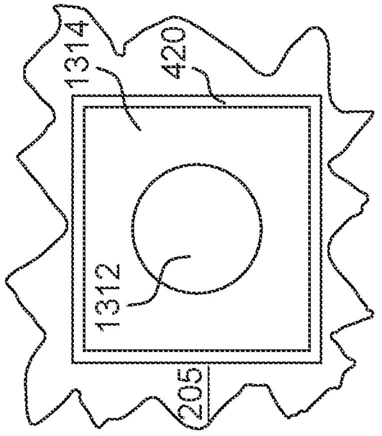
FIG. 15 is a schematic partial top view of the transfer apparatus shown in FIG. 13, according to one implementation.

FIG. 15 is a schematic partial top view of the transfer apparatus 1300 shown in FIG. 13, according to one implementation.

Figure 16:
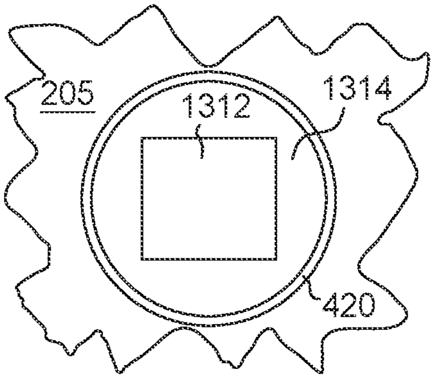
FIG. 16 is a schematic partial top view of the transfer apparatus shown in FIG. 13, according to one implementation.

FIG. 16 is a schematic partial top view of the transfer apparatus 1300 shown in FIG. 13, according to one implementation.

Figure 17:
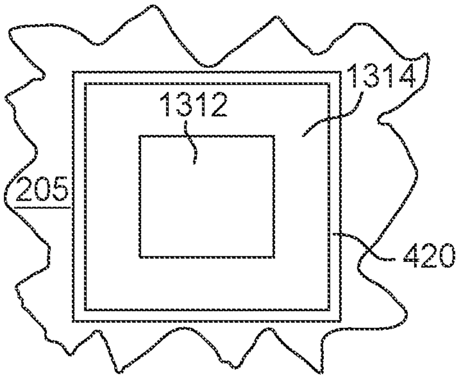
FIG. 17 is a schematic partial top view of the transfer apparatus shown in FIG. 13, according to one implementation.

FIG. 17 is a schematic partial top view of the transfer apparatus 1300 shown in FIG. 13, according to one implementation.

The transfer apparatus 1300 includes a plurality of substrate supports 1310 (one is shown in FIG. 13). Each of the substrate supports 1310 can be similar to the substrate supports 210 described above, and can include one or more of the features, aspects, components, operations, and/or properties thereof.

Each substrate support 1310 includes an inner segment 1312 and one or more fins 1314. Each inner segment 1312 includes a support portion 1315 on a first side of the one or more fins 1314. Each inner segment 1312 includes an insertion portion 1316 on a second side of the one or more fins 1314. The insertion portion 1316 extends into a retention opening 1309 formed in the recessed surface 420 of one of the plurality of arms 204.

In the implementation shown in FIG. 13, the inner segment 1312 is semi-ball shaped (such as semi-spherical in shape or semi-ovular in shape) and rectangular or cylindrical in shape. Each of the one or more fins 1314 is cylindrical or rectangular in shape. The support portion 1315 is semi-ball shaped (such as semi-spherical in shape or semi-ovular in shape), and the insertion portion 1316 is cylindrical or rectangular in shape.

In the implementation shown in FIG. 14, the inner segment 1312 is cylindrical in shape, and each of the one or more fins 1314 is cylindrical in shape.

In the implementation shown in FIG. 15, the inner segment 1312 is cylindrical in shape, and each of the one or more fins 1314 is rectangular in shape.

In the implementation shown in FIG. 16, the inner segment 1312 is rectangular in shape, and each of the one or more fins 1314 is cylindrical in shape.

In the implementation shown in FIG. 17, the inner segment 1312 is rectangular in shape, and each of the one or more fins 1314 is rectangular in shape.

Figure 18:
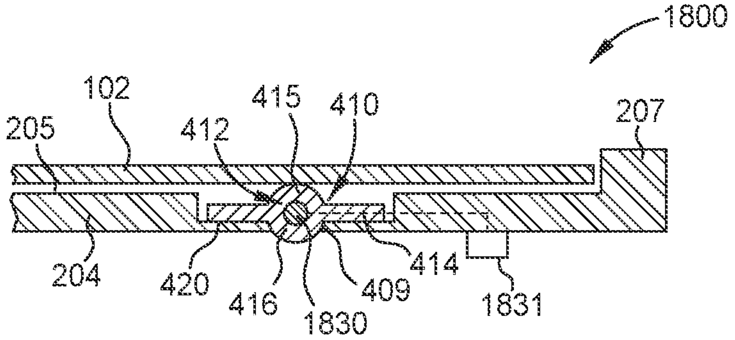
FIG. 18 is a schematic side cross-sectional view of a transfer apparatus, according to one implementation.

FIG. 18 is a schematic side cross-sectional view of a transfer apparatus 1800, according to one implementation. The transfer apparatus 1800 can be similar to the transfer apparatus 700 described above, and can include one or more of the features, aspects, components, operations, and/or properties thereof.

The transfer apparatus 1800 includes one or more heat transfer elements 1830 embedded in the inner segment 412 of at least one of (such as each of) the plurality of substrate supports 410. Each heat transfer element 1830 is configured to heat and/or cool the respective substrate support 410, substrate 102 supported thereon, and/or the body 202 (such as the arm 204) using a source 1831 that is external to the respective substrate support 410. The source 1831 is fluidly and/or electrically connected to the heat transfer element 1830. The heat transfer element 1830 can include, for example, a cooling channel (that flows fluid therethrough, such as cooling water, air, or a refrigerant) and/or an electrical line (that conducts electricity therethrough) such that the substrate support 410 is a resistive heater. The heat transfer element 1830 can include an electrical coil or an electrical mesh. A cross-section of the heat transfer element 1830 can be circular (as shown in FIG. 18) or rectangular. In one or more embodiments, the heat transfer element 1830 is positioned inwardly of the one or more fins 414 and is positioned at least partially between the support portion 415 and the insertion portion 416. In one or more embodiments, the source 1831 is a battery that is mounted to the body 202 (such as the arm 204. The present disclosure contemplates that the source 1831 can be external to the body 202. For example, the source 1831 can be a power source of the transfer robot. In one or more embodiments, the source 1831 is wirelessly charged and/or the one or more heat transfer elements 1830 are wirelessly powered.

The heat transfer elements 1830 can be used to pre-heat the substrate supports 410 and the body 202 prior to contacting the substrate 102, and/or can be used to cool the substrate 102 while the substrate 102 is supported on the substrate supports 410.

Figure 19:
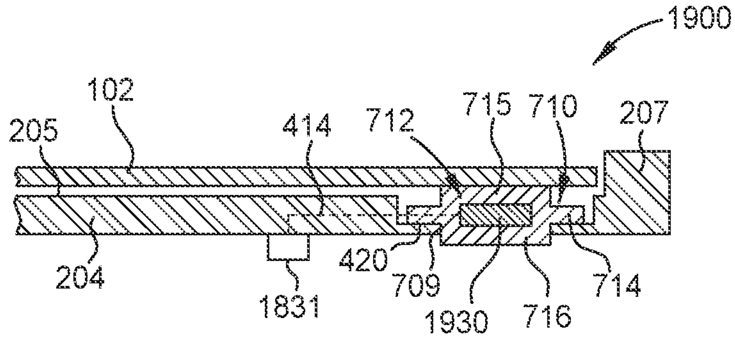
FIG. 19 is a schematic side cross-sectional view of a transfer apparatus, according to one implementation.

FIG. 19 is a schematic side cross-sectional view of a transfer apparatus 1900, according to one implementation. The transfer apparatus 1900 can be similar to the transfer apparatus 700 described above, and can include one or more of the features, aspects, components, operations, and/or properties thereof. The transfer apparatus 1900 includes one or more heat transfer elements 1930 embedded in the inner segment 412 of at least one of (such as each of) the plurality of substrate supports 410. Each heat transfer element 1930 can be similar to the heat transfer element 1830 described above, and can include one or more of the features, aspects, components, operations, and/or properties thereof.

In the implementation shown in FIG. 19, the heat transfer element 1930 has a rectangular cross-section.

Figure 20:
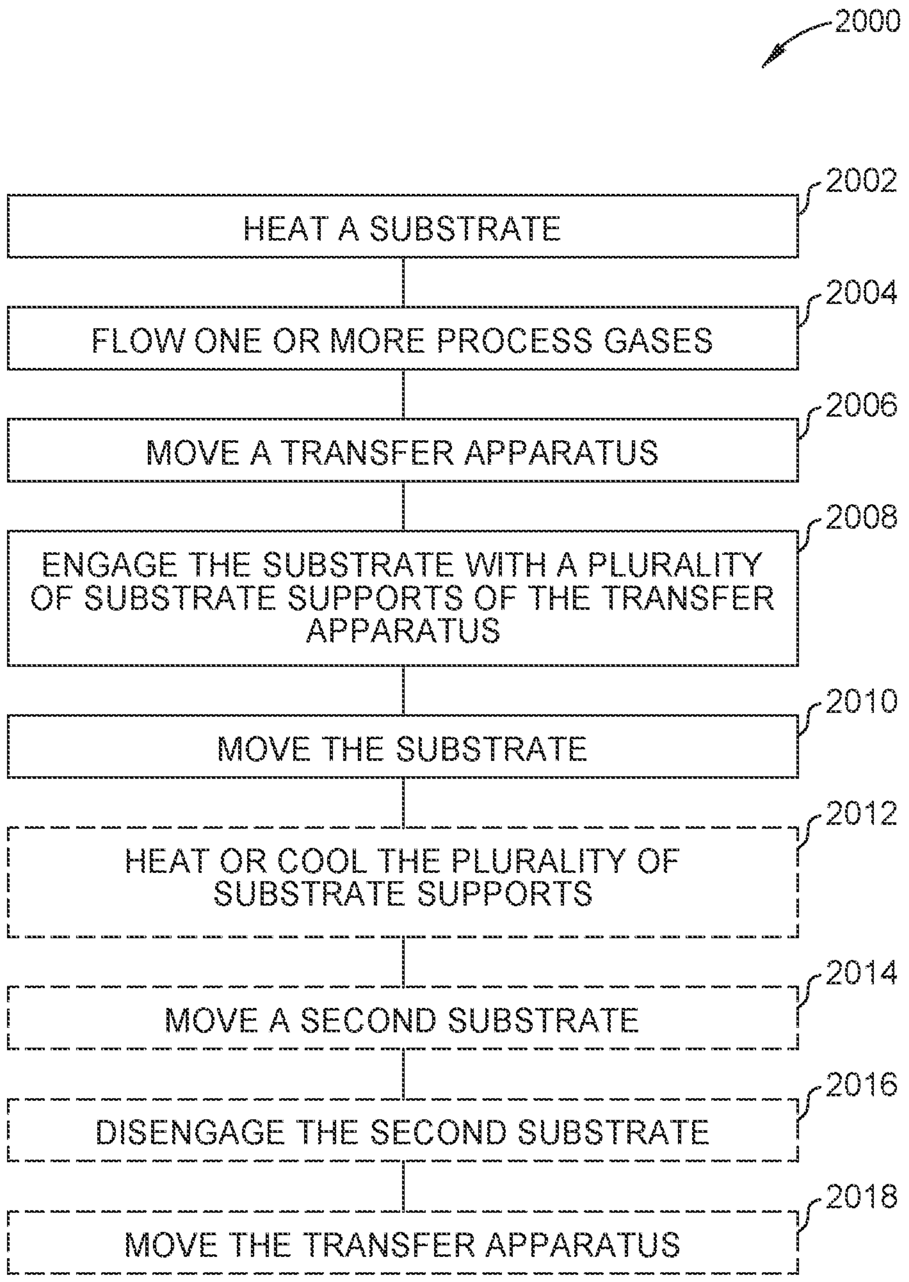
FIG. 20 is a schematic block diagram view of a method of processing a substrate for semiconductor manufacturing, according to one implementation.

FIG. 20 is a schematic block diagram view of a method 2000 of processing a substrate for semiconductor manufacturing, according to one implementation.

Operation 2002 of the method 2000 includes heating a substrate positioned in a processing volume of a processing chamber.

Operation 2004 includes flowing one or more process gases over the substrate to form one or more layers on the substrate.

Operation 2006 includes moving a transfer apparatus into the processing volume. The transfer apparatus is a transfer apparatus discussed herein (such as the transfer apparatus 200 described above).

Operation 2008 includes engaging the substrate with a plurality of substrate supports (such as the substrate supports 210) of the transfer apparatus.

Operation 2010 includes moving the substrate out of the processing volume while the substrate is supported on the plurality of substrate supports.

Optional operation 2012 includes heating or cooling the plurality of substrate supports using one or more heat transfer elements embedded in the plurality of substrate supports.

Optional operation 2014 of the method 2000 includes moving a second substrate into a processing volume of the processing chamber while the second substrate is supported on the plurality of substrate supports of the transfer apparatus.

Optional operation 2016 includes disengaging the second substrate from the plurality of substrate supports.

Optional operation 2018 includes moving the transfer apparatus out of the processing volume.

Figure 21:
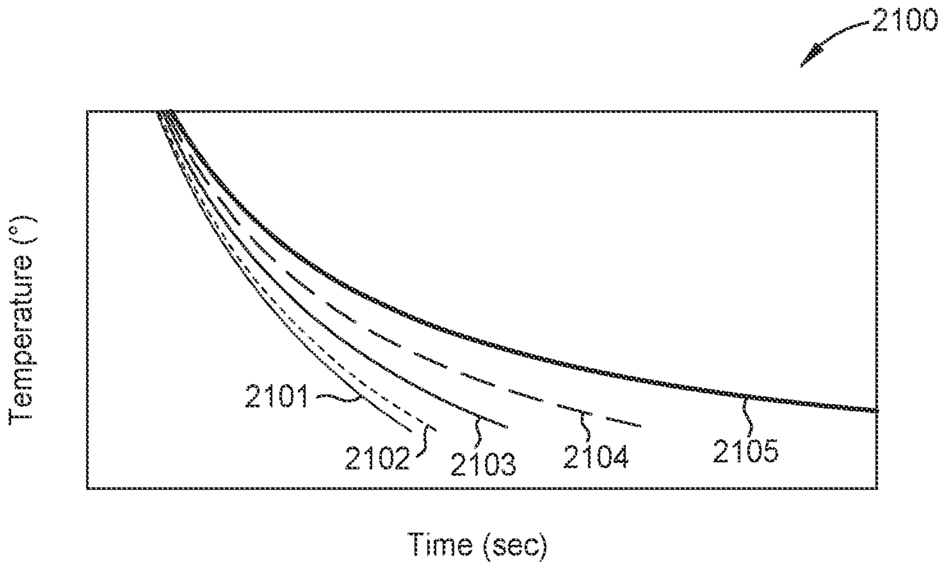
FIG. 21 is a schematic graphical view of a graph showing substrate temperature (in degrees Celsius) versus time (in seconds) in relation to a plurality of cool-down profiles for substrates, according to one implementation.

FIG. 21 is a schematic graphical view of a graph 2100 showing substrate temperature (in degrees Celsius) versus time (in seconds) in relation to a plurality of cool-down profiles 2101-2105 for substrates, according to one implementation. The cool-down profiles 2101-2105 correspond to different heating powers used for processing to heat the substrates such that the heating power increases from the first profile 2101 to the fifth profile 2105. For example, the first profile 2101 is the lowest heating power, the fifth profile 2105 is the highest heating power, the second profile 2102 is a lower heating power than the third profile 2103, and the fourth profile 2104 is a higher heating power than the third profile 2103.

As shown by the graph 2100, the higher a processing temperature (e.g., a temperature to which a substrate is heated) is, the longer it will take for a substrate to cool down to a target temperature after processing. As shown by the graph 2100, the higher a heating power that is used for processing, the longer it will take for a substrate to cool down to a target temperature after processing. The longer time means that operations must wait longer for the substrate to cool (which can result in increased downtime and reduced throughput), or a larger temperature difference will exist between the substrate and a transfer apparatus when the substrate lands on the transfer apparatus for removal from the chamber. A larger temperature difference between the substrate and the transfer apparatus can increase the chances of thermal shock for the substrate when the substrate contacts the transfer apparatus, which can result in defects (e.g., bowing and/or breakage) of the substrate.

The subject matter described herein facilitates reduced or eliminated chances of thermal shock (and associated chances of defects) while facilitating using higher processing temperatures and/or higher heating powers for substrate processing (which facilitates enhanced deposition uniformity and device performance, reduced processing times, reduced downtime, and increased throughput). For example, a heating temperature of 600 degrees Celsius or higher can be used, such as 1,000 degrees Celsius or higher. As an example, the substrate supports described herein (such as the thickness ratio and/or the dimension ratio) facilitate reduced contact surface areas between the substrate and the substrate supports while facilitating larger substrate support areas for the substrate supports absorbing heat (e.g., from chamber components such as the substrate support 106) before contacting the substrate to reduce the temperature difference.

Benefits of the present disclosure include reduced or eliminated chances of thermal shock (and associated chances of defects such as bowing and/or breakage; reduced temperature differences between substrates and transfer apparatus; faster heating and/or cooling of transfer apparatus (e.g., reduced cool-down times); reduced or eliminated chances of substrate defects (such as scratching and/or particle accumulation); higher processing temperatures; higher heating powers; enhanced deposition uniformity and device performance; reduced processing times, delays, and downtime; and increased throughput.

It is contemplated that one or more aspects disclosed herein may be combined. As an example, one or more aspects, features, components, operations and/or properties of the various implementations of the processing chamber 100, the controller 120, the transfer apparatus 200, the transfer apparatus 400, the transfer apparatus 700, the transfer apparatus 1300, the transfer apparatus 1800, the transfer apparatus 1900, the method 2000, and/or the graph 2100 may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof, and the scope thereof is determined by the claims that follow.

What is claimed is:

1. A transfer apparatus for moving a substrate in relation to semiconductor manufacturing, the transfer apparatus comprising:

a body; and a plurality of substrate supports inserted at least partially into the body, each of the plurality of substrate supports comprising:

an inner segment, and one or more fins extending outwardly relative to the inner segment, each of the inner segment and the one or more fins comprising silicon carbide (SiC), the inner segment comprising:

a support portion on a first side of the one or more fins, the support portion extending past a support face of the body and outwardly relative to the one or more fins, the one or more fins having a fin major dimension that is larger than a segment major dimension of the support portion, and an insertion portion on a second side of the one or more fins, the insertion portion extending into a retention opening formed in one of the plurality of arms.

2. The transfer apparatus of claim 1, wherein the body is a blade, each of the inner segment and the one or more fins is formed of the SiC, the blade has a thickness, the fin major dimension is a dimension ratio of the thickness, and the dimension ratio is 2.0 or higher.

3. The transfer apparatus of claim 1, wherein each of the inner segment and the one or more fins is formed of graphite coated with the SiC.

4. The transfer apparatus of claim 1, wherein the inner segment is ball shaped, and each of the one or more fins is cylindrical or rectangular in shape.

5. The transfer apparatus of claim 1, wherein the inner segment is rectangular in shape, and each of the one or more fins is cylindrical or rectangular in shape.

6. The transfer apparatus of claim 1, wherein the inner segment is cylindrical in shape, and each of the one or more fins is cylindrical or rectangular in shape.

7. The transfer apparatus of claim 1, wherein the inner segment is semi-ball shaped and cylindrical in shape, and each of the one or more fins is cylindrical or rectangular in shape.

8. The transfer apparatus of claim 1, further comprising one or more heat transfer elements embedded in the inner segment of at least one of the plurality of substrate supports.

9. A transfer apparatus for moving a substrate in relation to semiconductor manufacturing, the transfer apparatus comprising:

a body comprising:

a wrist, and a plurality of arms defining a support face, the plurality of arms each having an arm thickness, and the plurality of arms are each formed of an arm material; and a plurality of substrate supports inserted at least partially into the support face of the body, each of the plurality of substrate supports formed of a support material that is different than the arm material, and each of the plurality of substrate supports comprising:

an inner segment, and one or more fins extending outwardly relative to the inner segment, each of the one or more fins having a fin thickness that is a thickness ratio of the arm thickness, and the thickness ratio is 0.7 or less.

10. The transfer apparatus of claim 9, wherein the support material comprises silicon carbide (SiC), and the arm material comprises quartz (SiO2).

11. The transfer apparatus of claim 9, wherein the wrist comprises a wrist ledge, each of the plurality of arms comprises an arm ledge, and each of the plurality of substrate supports is positioned inwardly of the wrist ledge and each arm ledge.

12. The transfer apparatus of claim 9, wherein the inner segment comprises:

a support portion on a first side of the one or more fins, the support portion extending past the support face and outwardly relative to the one or more fins, the one or more fins having a fin major dimension that is larger than a segment major dimension of the support portion; and an insertion portion on a second side of the one or more fins, the insertion portion extending into a retention opening formed in one of the plurality of arms.

13. The transfer apparatus of claim 12, wherein the support portion extends past the support face by a gap, the gap is a gap ratio of the arm thickness, and the gap ratio is 0.3 or higher.

14. The transfer apparatus of claim 9, wherein the inner segment has a segment major dimension and each of the one or more fins has a fin major dimension, wherein the fin major dimension is larger than the segment major dimension.

15. The transfer apparatus of claim 14, wherein the fin major dimension is a dimension ratio of the arm thickness, and the dimension ratio is 2.0 or higher.

16. The transfer apparatus of claim 15, wherein the dimension ratio is 4.0 or higher.

17. The transfer apparatus of claim 9, wherein the support material has a thermal conductivity that is at least 100 W/m**K.

18. The transfer apparatus of claim 17, wherein the support material has an absorptivity that absorbs at least 95% of light having a wavelength in the infrared (IR) range.

19. A method of processing a substrate for semiconductor manufacturing, comprising:

heating a substrate positioned in a processing volume of a processing chamber;

flowing one or more process gases over the substrate to form one or more layers on the substrate;

moving a transfer apparatus into the processing volume, the transfer apparatus comprising:

a body, and a plurality of substrate supports inserted at least partially into the body, each of the plurality of substrate supports comprising:

an inner segment, and one or more fins extending outwardly relative to the inner segment, each of the inner segment and the one or more fins comprising silicon carbide (SiC), the inner segment comprising:

a support portion on a first side of the one or more fins, the support portion extending past a support face of the body and outwardly relative to the one or more fins, the one or more fins having a fin major dimension that is larger than a segment major dimension of the support portion, and an insertion portion on a second side of the one or more fins, the insertion portion extending into a retention opening formed in one of the plurality of arms;

engaging the substrate with the plurality of substrate supports; and moving the substrate out of the processing volume while the substrate is supported on the plurality of substrate supports.

20. The method of claim 19, further comprising heating or cooling the plurality of substrate supports using one or more heat transfer elements embedded in the plurality of substrate supports.

* * * * *